United States Patent
Kim et al.

(10) Patent No.: US 12,349,389 B2
(45) Date of Patent: Jul. 1, 2025

(54) LATERAL III/V HETEROSTRUCTURE FIELD EFFECT TRANSISTOR

(71) Applicant: Infineon Technologies Austria AG, Villach (AT)

(72) Inventors: Hyeongnam Kim, Chandler, AZ (US); Mohamed Imam, Chandler, AZ (US)

(73) Assignee: Infineon Technologies Austria AG, Villach (AT)

( * ) Notice: Subject to any disclaimer, the term of this patent is extended or adjusted under 35 U.S.C. 154(b) by 533 days.

(21) Appl. No.: 17/880,167

(22) Filed: Aug. 3, 2022

(65) Prior Publication Data

US 2023/0052141 A1 Feb. 16, 2023

(30) Foreign Application Priority Data

Aug. 10, 2021 (EP) ..................................... 21190570

(51) Int. Cl.
*H01L 29/20* (2006.01)
*H10D 30/01* (2025.01)
*H10D 30/47* (2025.01)
*H10D 62/824* (2025.01)
*H10D 62/85* (2025.01)
*H10D 64/00* (2025.01)

(52) U.S. Cl.
CPC ......... *H10D 30/475* (2025.01); *H10D 30/015* (2025.01); *H10D 62/824* (2025.01); *H10D 62/8503* (2025.01); *H10D 64/111* (2025.01)

(58) Field of Classification Search
CPC .. H10D 30/015; H10D 30/475; H10D 62/106; H10D 62/343; H10D 62/824; H10D 62/8503
See application file for complete search history.

(56) References Cited

U.S. PATENT DOCUMENTS

| | | | |
|---|---|---|---|
| 11,211,481 B2* | 12/2021 | Udrea | H10D 30/6738 |
| 2009/0065810 A1 | 3/2009 | Honea et al. | |
| 2013/0056744 A1 | 3/2013 | Mishra et al. | |
| 2016/0035853 A1 | 2/2016 | Kaneko et al. | |
| 2017/0154988 A1 | 6/2017 | Hurkx et al. | |
| 2021/0217882 A1* | 7/2021 | Udrea | H10D 64/62 |
| 2023/0117946 A1* | 4/2023 | Udrea | H10D 62/343 |
| | | | 257/183 |

FOREIGN PATENT DOCUMENTS

| | | |
|---|---|---|
| KR | 100770132 B1 | 10/2007 |
| WO | 2021144297 A1 | 7/2021 |

OTHER PUBLICATIONS

Chen, Kevin J., "GaN-on-Si Power Technology: Devices and Applications", IEEE Transactions On Electron Devices, vol. 64, No. 3, Mar. 2017, pp. 779-795.

* cited by examiner

*Primary Examiner* — Jaehwan Oh
(74) *Attorney, Agent, or Firm* — Murphy, Bilak & Homiller, PLLC

(57) ABSTRACT

The invention relates to a lateral field effect transistor, in particular a HEMT having a heterostructure, in a III/V semiconductor system with a p-type semiconductor being arranged between an ohmic load contact, in particular a drain contact, and a gate contact of the transistor for an injection of holes into a portion of the transistor channel. Further, a recombination zone implemented by a floating ohmic contact is provided for to improve the device performance.

15 Claims, 4 Drawing Sheets

LATERAL III/V HETEROSTRUCTURE FIELD EFFECT TRANSISTOR

TECHNICAL FIELD

The present invention relates to a lateral field effect transistor (FET) namely FET in which a transistor channel extends laterally with regard to a substrate plane. In particular, the invention relates to III/V FET, namely an FET based upon at least one material from the III/V class such as from the GaAs—AlGaAs system or from the GaN—AlGaN system. More particularly, the invention relates to a heterostructure FET wherein a III/V channel layer is combined with III/V barrier layer and the latter has a wider band gap than the former and is adjacent thereto. Finally, the present invention is directed to a transistor having an n channel wherein the conductivity is by electrons in the conduction band.

BACKGROUND

Such FETs have found a particularly advantageous implementation in the so-called HEMT, namely the high electron mobility transistor. It is based on the high mobility of conducting electrons in the channel being separated from doping atoms which are the origin of the n conductivity of the channel.

Further, it is known to add p-type semiconductor material between a gate contact and a drain contact of the FET, in particular a p-type semiconductor having a smaller band gap than the barrier layer and in particular of a similar material as the channel layer. This feature has proven to be useful in view of a certain performance degradation, which is attributed to the trapping of conducting electrons, in particular in case of fast switching and high electric fields acting upon these electrons. Consequently, the dynamic resistance between drain and source (in the on-state) increased and the device performance degraded.

These phenomena are particularly typical for the GaN-based material class.

In particular, p-type semiconductor material between a gate contact and a drain contact also may exist in FETs implemented as bi-directional switches (BDSs), in particular if implemented with at least two gate contacts. In these BDSs, the source contact and the drain contact may change their roles (when changing the direction) and one of the at least two gate contacts is actually used as "the" gate contact, usually the one more proximate to the source contact. Consequently, a further gate contact may be quite close to the drain contact. This contact may have a p-type semiconductor material under it, e. g. in order to be normally-off. Therefore, the p-type semiconductor might also be present there. However, also symmetric designs exist with one gate contact between the source contact and the drain contact. Also here, p-type semiconductor material could be proximate to the drain for the above reasons of the dropping-caused device degradation. (Hereunder, the more general term "load contact" is used to comprise source contacts and drain contacts, which, as explained, may change their roles in certain embodiments.)

According to one embodiment, the present invention is based upon the technical problem to improve the performance of lateral III/V heterostructure FETs having an n-channel and a p-type semiconductor between one of the load contacts and a proximate one of at least one gate contact, in particular between the drain contact and the gate contact of a unidirectional FET or a symmetric bi-directional FET.

SUMMARY

As explained, a p-type semiconductor is arranged between one of the load contacts and approximate one of the at least one gate contacts. The p-type semiconductor is adapted for injecting holes into a portion of the transistor channel, a function which is known as such in view of the above-mentioned trapping-caused degradation but also existent with for example the p-type semiconductor of a second and momentarily unused gate contact of a BDS.

The inventors have found that the performance of the FET can be further enhanced by taking measures against an extended diffusion of such injected holes in the transistor. In particular, they propose a floating ohmic contact between the above p-type semiconductor and the proximate gate contact, namely as a recombination zone for the injected holes. (In order to improve clarity, the load contacts are hereunder named as ohmic load contacts because they are ohmic contacts as well, naturally.) The term "between" related to the lateral direction and in the case of doubt the contacts shall be understood to end with the transition between metallically-conducting material and semiconducting material in the lateral dimension (one-dimensional model). This applies to the ohmic (load) contacts as well as to the (non-ohmic) gate contact(s).

The recombination zone provided for by the (further) ohmic contact according to the invention enhances the recombination of holes injected by the p-type semiconductor discussed above. Namely, the ohmic contact provides for a high concentration of electrons as well as flat electric field, and thus for an efficient recombination of at least a part of such holes. This counteracts an extended diffusion of the injected holes which can, due to such a diffusion, be accumulated for example by the gate region, in particular the gate edge of the FET.

Experiments have shown that the dynamic lifetime and possibly even the static lifetime can be improved in this manner. Also, problems of device failure other than the required lifetime have shown to be improved, the device failure being attributed to an accumulation of injected holes by the gate edge of the transistor. In particular, problems associated with an avalanche type of transistor breakdown due to energetic holes at high voltage in the off state of the transistor have been improved.

The floating ohmic contact proposed differs from any "active" contact participating in the electric circuit and connected to the wiring since it is, by definition, "floating". This means that there is no galvanic connection to a defined and possibly varying potential of the circuitry.

In the lateral dimension, the floating ohmic contact could be arranged preferably between 0.2 µm to 1.0 µm from the p-type semiconductor, wherein more preferred lower limits are at 0.3 µm and at 0.4 µm and more preferred upper limits are at 0.9 µm, at 0.8 µm and at 0.7 µm. Preferably, the floating ohmic contact is nearer to the ohmic load contact than to any gate contact. Further, a distance between the floating ohmic contact and the p-type semiconductor near the drain contact can preferably be between 0.2 µm and half of the difference between: a distance Lgd between p-type III/V semiconductor at the gate and p-type III/V semiconductor at the drain (in standard HEMTs or, in BDSs, the distance between p-type III/V semiconductor and p-type III/V semiconductor) on the one hand and on the other hand the length of the floating ohmic contact.

A preferred material system for implementing the invention comprises nitrogen (N) as the group V element of the III/V semiconductor, even more preferably only N. Preferably, this applies to any large band gap material as well. III-nitride-based HEMTs have high density of electrons in the channel thanks to spontaneous and piezoelectric polarization attributed to the lack of inversion symmetry.

Most preferred are gallium nitride (GaN) and/or aluminum nitride (AlN) as the basis for the material system, preferably with a mixture of gallium (Ga) and aluminum (Al) to adjust the band gap.

A preferred implementation of the invention according to this embodiment is a normally-off transistor which, for this purpose, has a further p-type semiconductor between the at least one gate contact and the transistor channel.

A preferred extension or "length" of the floating ohmic contact in the lateral direction can be between 0.2 µm and 1.9 µm. Further, this extension can preferably be smaller than 20% of the above defined length Lgd.

This length has proven to be advantageous in view of the recombination effect desired and in order not to disturb the design as regards availability of space and insulation distances.

In a preferred arrangement, the ohmic load contacts are arranged on the already mentioned barrier layer (of the heterostructure, if any) on a side opposite to the substrate. In other words, the ohmic load contacts are "above" the barrier layer and the channel layer is "below" it.

In this context, a recess in the barrier layer for the arrangement of the (at least one) gate contact is preferred. Naturally, in case of multiple gate contacts, each one could have its own recess or a plurality thereof could share a common recess.

This combines the advantageous heterostructure with a very direct control of the transistor channel by the gate contact.

In a further preferred implementation, the field effect transistor can have a further large band gap III/V semiconductor layer on a substrate side of the channel layer and thus on the side of the channel layer opposite to the ohmic load contacts. This further III/V semiconductor layer shall extend at least between the two ohmic load contacts in an uninterrupted manner (with regard to the lateral direction). It can for example be a buffer layer for adapting to a different lattice constant of a substrate such as a silicon substrate. It could also be a so-called back barrier layer. In the latter case, the floating ohmic contact preferably extends through the channel layer at least to the back barrier layer. (Reference is made to that the contact shall extend as far as the metallic conductivity.) The said extension at least to the back barrier layer improves the efficiency of the recombination zone function in collecting a higher ratio of the diffusing holes.

As already explained above, there are different implementations of this embodiment of the invention. In one preferred case, the distance between the gate contact and the ohmic load contacts is different, one being larger than the other one. Naturally, in case of a transistor design having a plurality of combined (parallel) transistor cells, this applies to at least one respective transistor cell.

Another preferred case is a bidirectional transistor having symmetrical distances between the one gate contact and the ohmic load contacts, again as regards at least one respective transistor cell in case of a plurality thereof.

A still further preferred case is a bidirectional transistor having two gate contacts (per transistor cell in case of a plurality). Therein, the already mentioned further p-type semiconductor between (one of) the gate contact(s) and the transistor channel on the one hand and the even earlier mentioned p-type semiconductor between one of the ohmic load contacts and the (proximate) gate contact on the other hand can be combined or, in other words, the one is as effective as the other and both are unitary. The other one of the two gate contacts is then effective as the (operative) gate contact between the ohmic load contacts. Naturally, the function of the two gate contacts is exchanged and they are effective vice versa for the opposite operation direction of the bidirectional field effect transistor.

As already mentioned, the invention also relates to a manufacturing method. In this method, the production of the floating ohmic contact and of the ohmic load contacts are combined in that these ohmic contacts are produced simultaneously and by means of basically the same technology. Then, the main additional measure to implement the invention can be just a geometric addition in the layout of masks or e-beam patterns for lithography.

BRIEF DESCRIPTION OF THE DRAWINGS

Hereunder, two preferred embodiments of the invention will be explained in order to further illustrate the invention. The description thereof serves for illustration purposes only and shall not limit the scope of the claims.

DETAILED DESCRIPTION

Figure 1:
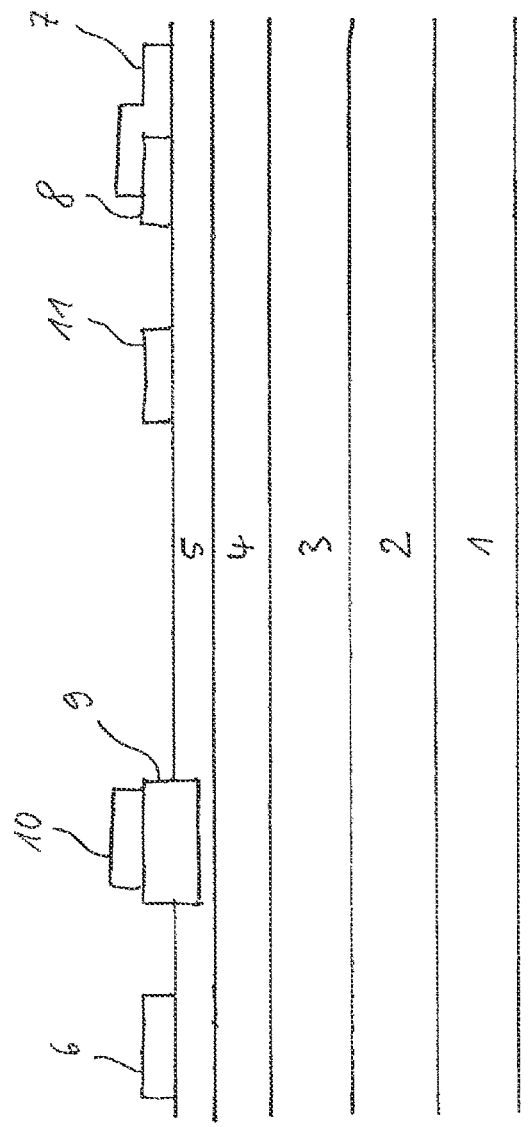
FIG. 1 shows a schematic section through a lateral field effect transistor according to the invention.

FIG. 1 shows a sectional drawing wherein the plane of section is transverse to a substrate plane of a Si substrate 1. The lateral direction and thus the main direction of current flow within the semiconductor structure of the transistor to be described is horizontal in FIG. 1. The individual dimensions of the details such as the thicknesses of the semiconductor layers and metal layers and the lateral dimensions thereof, are not shown in a realistic proportion for the sake of clarity. Furthermore, structural details as well as additional layers and materials are omitted which are not essential for this description.

As already mentioned, the field effect transistor structure shown in FIG. 1 is based on a Si substrate 1 such as a wafer. Thereon, conventional buffer layers for an improved lattice match of the transistor structure to the substrate have reference numeral 2. A so-called back barrier layer 3 of AlGaN is given which may actually consist of more than one layer (a top layer being undoped and a bottom layer being p-type for compensation). On top thereof, a (relatively) small band gap layer 4, namely a GaN semiconductor layer and, thereon, a further (relatively) large band gap material, namely an AlGaN layer are provided which constitute a semiconductor heterostructure. At the interface between these two layers, a so-called two-dimensional electron gas is formed which constitutes a high electron mobility layer for a channel of the field effect transistor. Thus, a so-called HEMT is constituted.

The two-dimensional electron gas is located within the small band gap GaN layer 4 adjacent to the interface, namely at the upper end of this layer. Thus, this layer 4 is the transistor channel layer and the layer 5 is the barrier layer.

With regard to the conductivity, it should be added that as-grown III/N epitaxial layers without intentional doping are n-type and intentional p-doping is necessary for compensation. The small band gap layer 4 and the top barrier layer 5 are not intentionally doped. Thus, just the two-dimensional electron gas is conducting and the rest of this region semi-insulating.

On top of the (large band gap) barrier layer 5 of the heterostructure, various further structures are formed. First, two ohmic load contacts 6 and 7 are shown, namely a source contact 6 and a drain contact 7. Both are ohmic contacts in the sense of a low contact resistance to the two-dimensional electron gas at the interface between the heterostructure layers 4 and 5. For example, they could both be based on a metallization comprising a Ti/Al/Ti stack. Further, a gate contact 10 is formed between load contacts 6 and 7.

Thus, all device contacts 6, 7, 10 are on the same side of the substrate 1 and on the same side thereof as the semiconductor heterostructure and the so-called back barrier layer 3.

Adjacent to the drain contact 7, there is a structure of p-type GaN 8 which is spatially limited in the horizontal directions (parallel to the substrate plane), naturally. Also this drain-near p-type semiconductor 8 is known as such and has been described above. It serves for injecting holes into a portion of semiconductor layers 4 and 5, in order to reduce the above-mentioned trapping-caused device degradation. The p-GaN 8 is covered on the side opposite to the substrate by the metallization of the drain contact 7, in part.

A further p-type GaN structure 9 is provided between the gate contact 10 and the channel, as shown in FIG. 1. This p-GaN structure 9 renders the field effect transistor to be normally off. Here, the heterostructure barrier layer 5, namely the large band gap layer of AlGaN, has been thinned down to a considerable extent so that only a part of the AlGaN layer 5 is present thereunder. In other words, the p-GaN 9 of the gate contact 10 is arranged in a recess in the heterostructure barrier layer 5. This serves for a more direct control of the transistor channel by the gate contact 10.

As usual, the gate contact 10 is more proximate to the source contact 6 than to the drain contact 7. Between the drain contact 7, more precisely the p-GaN structure 8 proximate thereto, and the gate contact 10, more precisely the p-GaN structure 9 thereof, a floating ohmic contact 11 is provided as shown. This ohmic contact 11 is, as such, a conventional ohmic contact which can be based on the same Ti/Al/Ti technology as mentioned above with regard to the source contact 6 and the drain contact 7. However, the ohmic contact 11 is floating and is thus not connected to any reference potential.

A diffusion area under the ohmic contact 11, namely in the semiconductor layers, in terms of a high doping region of metallic or almost metallic conductivity, shall extend not only through the heterostructure layers 4 and 5 but also into the back barrier AlGaN layer 3. This is because the floating ohmic contact shall provide an effective recombination zone preferably not only in the uppermost layers 4 and 5 but down towards the substrate preferably including at least a substantial part of the back barrier layer. Since the floating ohmic contact is meant for enhancing the recombination of holes injected by the p-GaN structure 8, the possibility of such holes diffusing also in "deeper" regions of the device structure may be taken into account and, accordingly, the effectiveness of the floating ohmic contact 11 can be improved in that the metallically conducting region thereunder is not too shallow.

Basically, the recombination zone due to the floating ohmic contact 11 inhibits or reduces a further propagation of a hole current injected by the p-GaN structure 8. In particular, this hole current injection occurs due to a parasitic pn-diode during transistor switching (when the drain potential increases, i. e. when the transistor goes from a conducting into a non-conducting state). The diffusion of such injected holes has conventionally caused device degradation as explained earlier in this description. The above-described recombination zone provides for an effective countermeasure by simple means.

Typical lateral dimensions are a length in the horizontal direction of FIG. 1 (the main current direction of the transistor) of the floating ohmic contact 11 of about 1 µm and a respective distance from the p-GaN structure 8 of about 1 µm in this embodiment. A typical distance between the floating ohmic contact 11 and the p-GaN structure 9 under the gate contact 10 is about 8 µm, depending on the voltage rate, whereas the distance between the p-GaN structure 9 and the source contact 6 is between about 0.5 µm and about 1.4 µm, here.

Figure 2:
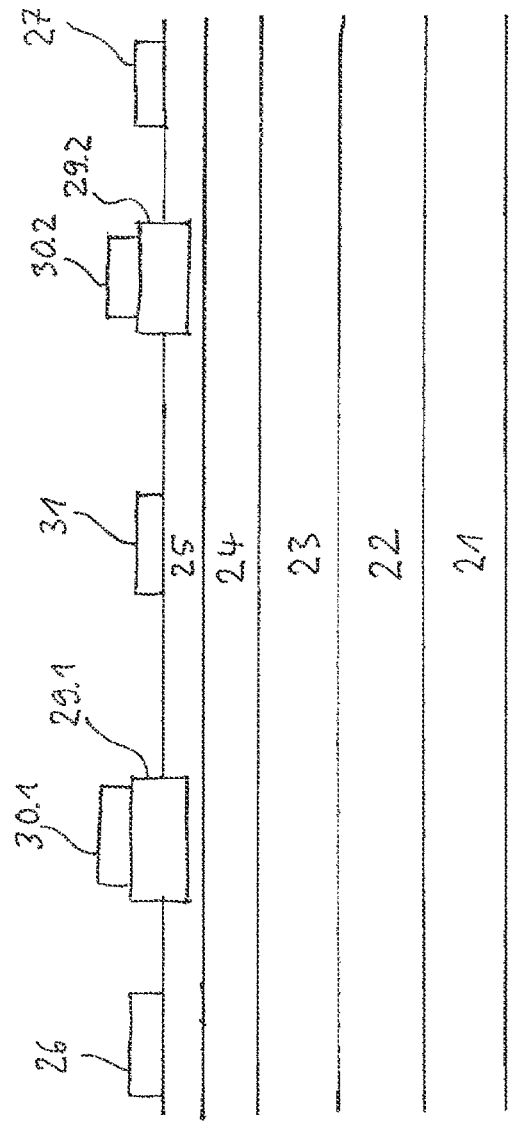
FIG. 2 shows a schematic section through a bidirectional lateral field effect transistor according to the invention.

FIG. 2 illustrates a second embodiment which is a bidirectional HEMT. The structure is quite similar to the first embodiment and the reference numerals are increased by 20 to simplify the comparison. The description will concentrate on the differences and will not repeat what has already been described.

Since this embodiment relates to a bidirectional HEMT, the terms "source" and "drain" are replaced by "load contact". This relates to the reference numerals 26 and 27 in FIG. 2. Since the drain-near p-GaN structure 8 of the first embodiment is implemented differently in this second embodiment, both load contacts 26 and 27 resemble the source contact 6 of FIG. 1.

Moreover, for the bidirectional operation, two gate contacts 30.1 and 30.2 are provided instead of the one gate contact 10 of FIG. 1, both having a p-GaN structure as structure 9 in FIG. 1, compare reference numerals 29.1 and 29.2. As already explained, depending on the operation polarity, either the left load contact 26 or the right load contact 27 is in operation as the source contact (and the respective other as the drain contact) and, correspondingly, the left gate contact 30.1 or the right gate contact 30.2 is in operation as the gate contact of the actual transistor operation. The p-GaN structure under the respective other gate contact can then be regarded and used as replacing the drain-near p-GaN structure 8 of FIG. 1 since it is quite near to the respective actual drain in FIG. 2 and can act as a p-layer to form a diode which can inject holes when this diode is forward-biased.

Figure 3:
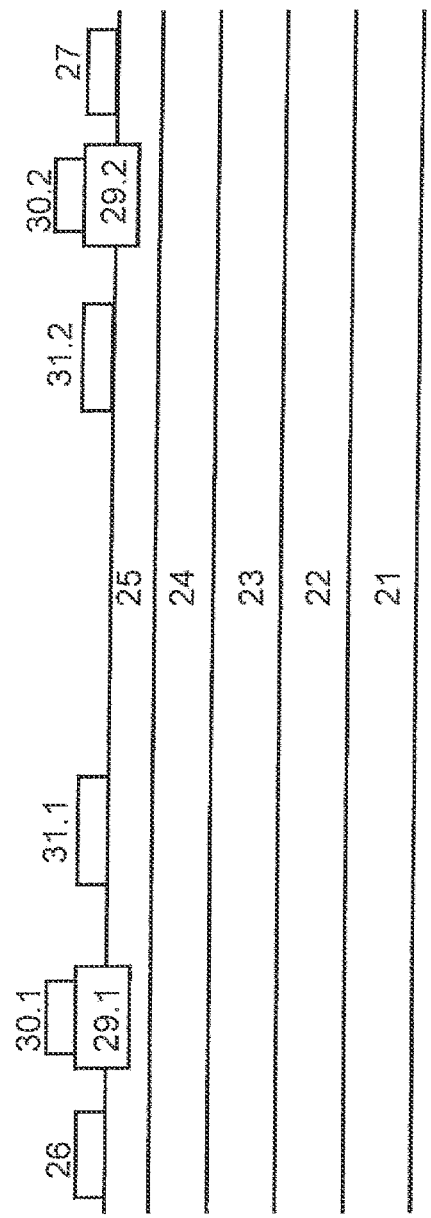
FIG. 3 shows a schematic section of a variation of the embodiment according to FIG. 2.

Due to the antisymmetric operability of the bidirectional HEMT of FIG. 2, the floating ohmic contact 31 of this invention is arranged symmetrically, i. e. in the centre between the load contacts 26 and 27. Thus, it serves for both operation polarities and, thus, both for holes injected by the p-GaN structure 29.1 and the p-GaN structure 29.2. Reference is now made to FIG. 3. This floating ohmic contact could also be split into two and one part 31.1 be placed near the one gate contact and the other part 31.2 near the other gate contact.

As regards the lateral dimensions, the distances between the load contacts 26 and 27 on the one side and the respective proximate p-GaN 29.1 or 29.2 of the respective proximate gate contact 30.1 or 30.2 may be similar as in the first embodiment and the same applies to the distance between these p-GaN structures 29.1 and 29.2, respectively, and the respective other (more distant) load contact 27 or 26.

Figure 4:
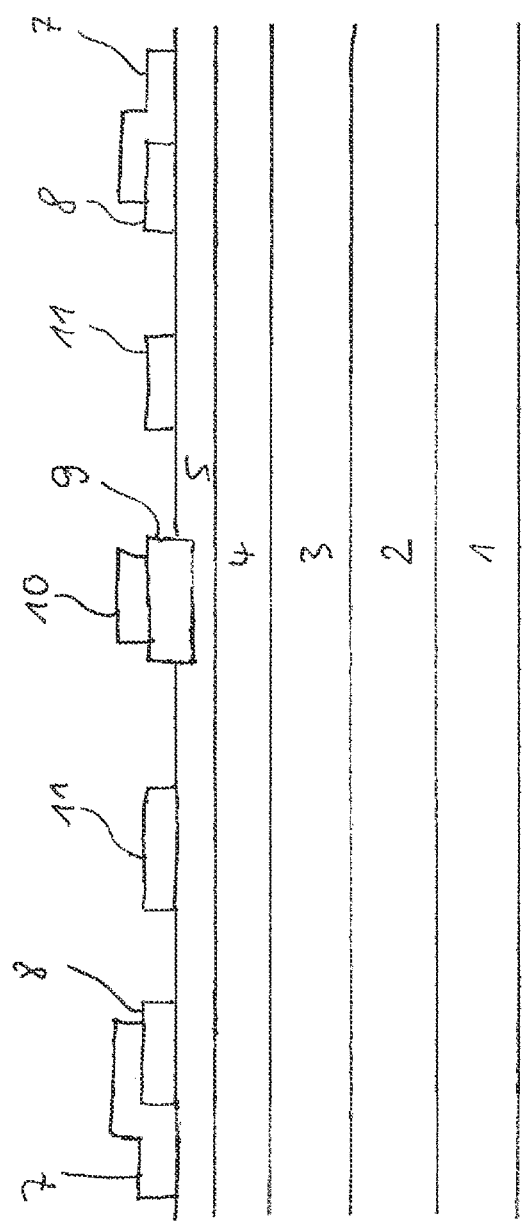
FIG. 4 shows a schematic section of a bidirectional field effect transistor according to the invention.

It is clear from the above explanations, that, in examples, a bidirectional HEMT could easily be implemented on the basis of the first embodiment by a symmetric arrangement of the gate contact 10 and the respective p-GaN structure 9 with regard to the load contacts 6 and 7 as shown in FIG. 4. Then, due to the bidirectional operation, a further floating ohmic contact such as the floating ohmic contact 11 in FIG. 1 should be added between the load contact 6 and the p-GaN 9 of the gate in a manner similar to the floating ohmic contact 11. In other words, a symmetrized version of the HEMT structure shown in FIG. 1 with one additional floating ohmic contact as depicted in FIG. 4 could be operated in both directions.

As explained above, the claims, terms and explanations also relate to an implementation with a plurality of transistor cells of analogous structure. Therein, the structures shown in FIGS. 1 and 2 represent one of the transistor cells and the plurality of cells could be arranged along the direction perpendicular to the plane of the drawing.

Further, as already explained as well, the invention also relates to a manufacturing method. For both embodiments, the respective floating ohmic contacts 11 and 31 can be produced together with and similar to the source contact 6, the drain contact 7 and the load contacts 26 and 27 so that the additional effort for the realization of the present invention is minimal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A lateral field effect transistor, comprising:
    a III/V semiconductor heterostructure having a III/V semiconductor channel layer and a III/V semiconductor barrier layer, the III/V semiconductor barrier layer having a larger band gap than the III/V semiconductor channel layer and being adjacent to the III/V semiconductor channel layer, the III/V semiconductor heterostructure defining a lateral transistor channel near an interface between the III/V semiconductor channel layer and the III/V semiconductor barrier layer and extended in a lateral direction;
    at least two ohmic load contacts for contacting the lateral transistor channel;
    at least one gate contact between the at least two ohmic load contacts, in the lateral direction;
    a p-type semiconductor between one of the at least two ohmic load contacts and a proximate one of the at least one gate contact, in the lateral direction, for an injection of holes into a portion of the transistor; and
    an ohmic contact as a recombination zone for the injected holes, the ohmic contact being arranged between the p-type semiconductor and the proximate gate contact, in the lateral direction,
    wherein the ohmic contact is floating.

2. The lateral field effect transistor of claim 1, wherein a distance between the ohmic contact and the p-type semiconductor is in a range of 0.2 μm to 1.0 μm.

3. The lateral field effect transistor of claim 1, wherein the group V element of the III/V semiconductor heterostructure comprises N.

4. The lateral field effect transistor of claim 3, wherein the III/V semiconductor heterostructure is GaN-based and/or AlN-based.

5. The lateral field effect transistor of claim 1, wherein the lateral field effect transistor is implemented as a normally-off transistor and further comprises an additional p-type semiconductor between the at least one gate contact and the lateral transistor channel.

6. The lateral field effect transistor of claim 5, wherein the lateral field effect transistor has two gate contacts per transistor cell and is implemented as a bidirectional field effect transistor, wherein, for a given operation direction of the bidirectional field effect transistor, the additional p-type semiconductor between one of the two gate contacts and the lateral transistor channel is effective as the p-type semiconductor between one of the at least two ohmic load contacts and the proximate gate contact and the other one of the two gate contacts is effective as the gate contact between the at least two ohmic load contacts, and wherein, for the opposite operation direction of the bidirectional field effect transistor, the two gate contacts are effective in the opposite manner.

7. The lateral field effect transistor of claim 1, wherein the ohmic contact between the p-type semiconductor and the proximate gate contact has a length, in the lateral direction, of between 0.2 μm and 1.9 μm.

8. The lateral field effect transistor of claim 1, wherein the at least two ohmic load contacts are arranged on a side of the III/V semiconductor barrier layer opposite to a substrate.

9. The lateral field effect transistor of claim 8, wherein the at least one gate contact is arranged in a region, in the lateral direction, where the III/V semiconductor barrier layer has a recess on the side opposite to the substrate.

10. The lateral field effect transistor of claim 1, further comprising a further III/V semiconductor layer on a substrate side of the III/V semiconductor channel layer.

11. The lateral field effect transistor of claim 10, wherein the further III/V semiconductor layer is extended between the at least two ohmic load contacts and is uninterrupted therebetween, in the lateral direction, wherein the at least two ohmic load contacts are on a side of the further III/V semiconductor layer opposite to a substrate, and wherein the further III/V semiconductor layer has a larger band gap than the III/V semiconductor channel layer.

12. The lateral field effect transistor of claim 11, wherein the further III/V semiconductor layer is a back barrier layer and the ohmic contact extends through the III/V semiconductor channel layer at least to the back barrier layer.

13. The lateral field effect transistor of claim 1, wherein the lateral field effect transistor has only one gate contact per transistor cell, wherein a distance between the gate contact and one of the at least two ohmic load contacts is larger than a distance between the gate contact and another one of the at least two ohmic load contacts, and wherein the at least two ohmic load contacts are of the respective transistor cell of the gate contact.

14. A method of manufacturing a field effect transistor, the method comprising:
    producing a III/V semiconductor heterostructure having a III/V semiconductor channel layer and a III/V semiconductor barrier layer, the III/V semiconductor barrier layer having a wider band gap than the III/V semiconductor channel layer and being adjacent to the III/V semiconductor channel layer, the III/V semiconductor heterostructure defining a lateral transistor channel between the III/V semiconductor channel layer and the III/V semiconductor barrier layer and extended in a lateral direction;

producing at least two ohmic load contacts for contacting the lateral transistor channel;

producing at least one gate contact between the at least two ohmic load contacts, in the lateral direction;

producing a p-type semiconductor between one of the at least two ohmic load contacts and a proximate one of the at least one gate contact, in the lateral direction, for an injection of holes into a portion of the transistor channel; and producing an ohmic contact as a recombination zone for the injected holes, the ohmic contact being arranged between the p-type semiconductor and the proximate gate contact, in the lateral direction, wherein the ohmic contact is floating.

15. The method of claim 14, wherein the ohmic contact is produced in one with and similar to the at least two ohmic load contacts.

* * * * *